(12) United States Patent
Kim et al.

(10) Patent No.: US 9,666,828 B2
(45) Date of Patent: May 30, 2017

(54) METHOD FOR PRODUCING A SUBSTRATE FOR ORGANIC ELECTRONIC DEVICES

(71) Applicant: LG Display Co., Ltd., Seoul (KR)

(72) Inventors: Young Eun Kim, Seoul (KR); Jong Seok Kim, Seoul (KR); Young Kyun Moon, Chungcheongbuk-do (KR); Jin Ha Hwang, Chungcheongbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/492,951

(22) Filed: Sep. 22, 2014

(65) Prior Publication Data

US 2015/0104891 A1    Apr. 16, 2015

Related U.S. Application Data

(63) Continuation of application No. PCT/KR2013/002462, filed on Mar. 25, 2013.

(30) Foreign Application Priority Data

Mar. 23, 2012 (KR) .......... 10-2012-0030249
Jul. 31, 2012  (KR) .......... 10-2012-0084215

(51) Int. Cl.
*H01L 21/00* (2006.01)
*H01L 51/52* (2006.01)
(Continued)

(52) U.S. Cl.
CPC ............ *H01L 51/5203* (2013.01); *G02B 5/02* (2013.01); *G02B 5/0221* (2013.01);
(Continued)

(58) Field of Classification Search
CPC ... G02B 5/02; H01L 51/5237; H01L 51/5203; H01L 51/5268; H01L 51/524;
(Continued)

(56) References Cited

U.S. PATENT DOCUMENTS

| 5,959,768 A | 9/1999 | Hutton |
| 2010/0072482 A1 | 3/2010 | Eom et al. |

(Continued)

FOREIGN PATENT DOCUMENTS

| CN | 1575075 A | 2/2005 |
| CN | 101617418 A | 12/2009 |

(Continued)

OTHER PUBLICATIONS

Laserod, "Direct Write Laser Patterning, Dry Etching and Structuring of TCO Coatings on Glass and Plastic Displays at Laserod" LIA Handbook of Laser Materials Processing, Laser Institute of America, Magnolia Publishing, Inc., 2001, p. 637.1-8.*

(Continued)

*Primary Examiner* — Shaun Campbell
(74) *Attorney, Agent, or Firm* — Dentons US LLP

(57) ABSTRACT

Provided are methods of manufacturing a substrate for an OED and an OED. According to the methods of manufacturing a substrate for forming an OED such as an OLED and an OED, a substrate for forming a device having excellent light extraction efficiency and improved reliability by preventing penetration of moisture or air into the device, or device using the same may be provided.

12 Claims, 8 Drawing Sheets

(51) Int. Cl.
  *H01L 51/00* (2006.01)
  *H01L 51/56* (2006.01)
  *H05B 33/10* (2006.01)
  *G02B 5/02* (2006.01)

(52) U.S. Cl.
  CPC ........ *G02B 5/0226* (2013.01); *H01L 51/0001* (2013.01); *H01L 51/0021* (2013.01); *H01L 51/0096* (2013.01); *H01L 51/5209* (2013.01); *H01L 51/5218* (2013.01); *H01L 51/5225* (2013.01); *H01L 51/5234* (2013.01); *H01L 51/5237* (2013.01); *H01L 51/5253* (2013.01); *H01L 51/5268* (2013.01); *H01L 51/5271* (2013.01); *H01L 51/5275* (2013.01); *H01L 51/56* (2013.01); *H05B 33/10* (2013.01); *H01L 2251/53* (2013.01); *H01L 2251/56* (2013.01); *Y02E 10/549* (2013.01); *Y02P 70/521* (2015.11)

(58) Field of Classification Search
  CPC ............. H01L 51/5206; H01L 51/0096; H01L 51/5253; H01L 51/5221; H01L 51/5218; H01L 51/5234; H01L 51/5271; H01L 51/56; H01L 51/0021; H01L 51/5209; H01L 51/5225; H01L 51/0001; H01L 2251/53; H01L 2251/56
  See application file for complete search history.

(56) References Cited

U.S. PATENT DOCUMENTS

| | | | |
|---|---|---|---|
| 2011/0006387 A1* | 1/2011 | Katsuno ............ | H01L 27/14625 257/433 |
| 2011/0042697 A1* | 2/2011 | Lee et al. ........................ | 257/89 |
| 2012/0252211 A1* | 10/2012 | Meulen et al. ............... | 438/674 |

FOREIGN PATENT DOCUMENTS

| | | | | |
|---|---|---|---|---|
| CN | 101790899 A | 7/2010 | | |
| CN | 102308407 A | 1/2012 | | |
| EP | 1445095 A1 | 8/2004 | | |
| JP | 62-124796 U | 8/1987 | | |
| JP | 7-98446 A | 4/1995 | | |
| JP | 11-26156 A | 1/1999 | | |
| JP | 2003-249366 A | 9/2003 | | |
| JP | 2004-22438 A | 1/2004 | | |
| JP | 2004-349064 | 12/2004 | | |
| JP | 2005-108678 | * | 4/2005 | ............ H05B 33/12 |
| JP | 2005108678 A | 4/2005 | | |
| JP | 2005-274741 A | 10/2005 | | |
| JP | 2006-331694 A | 12/2006 | | |
| JP | 2007-27140 A | 2/2007 | | |
| JP | 2007-052952 A | 3/2007 | | |
| JP | 2007-73405 A | 3/2007 | | |
| JP | 2007-287486 A | 11/2007 | | |
| JP | 2009-4275 A | 1/2009 | | |
| JP | 2009-54424 A | 3/2009 | | |
| JP | 2009-76452 A | 4/2009 | | |
| JP | 2010-129184 A | 6/2010 | | |
| JP | 2011-048937 | 3/2011 | | |
| KR | 10-2006-0068680 A | 6/2006 | | |
| KR | 10-2008-0075359 A | 8/2008 | | |
| TW | 2009-04246 A | 1/2009 | | |
| TW | 2011-01478 A1 | 1/2011 | | |
| TW | 201203649 A1 | 1/2012 | | |
| WO | 2011-126097 A1 | 10/2011 | | |
| WO | 2011/152275 A1 | 12/2011 | | |
| WO | 2012/020452 A1 | 2/2012 | | |

OTHER PUBLICATIONS

English translation of JP2005-108678, pp. 1-19.*

* cited by examiner (a)

(b)

METHOD FOR PRODUCING A SUBSTRATE FOR ORGANIC ELECTRONIC DEVICES

This application is a bypass continuation of International Application No. PCT/KR2013/002462 filed Mar. 25, 2013, which claims priority to Korean Patent Application Nos. 10-2012-0030249 filed Mar. 23, 2012 and 10-2012-0084215 filed Jul. 31, 2012, in the Korean Intellectual Property Office, all of which are incorporated herein by reference.

FIELD

The present application relates to a method of manufacturing a substrate for an organic electronic device (OED) or an OED, and an OED.

BACKGROUND

An OED is a device exhibiting various functions through exchange of charges between an electrode layer and an organic material, which includes an organic light emitting diode (OLED), an organic solar cell, an organic photo conductor (OPC), and an organic transistor.

The OLED, which is a representative OED, conventionally includes a substrate, a first electrode layer, an organic layer including an emitting layer and a second electrode layer, which are sequentially stacked.

In the structure, which is, so called, a bottom emitting device, the first electrode layer may be a transparent electrode layer, and the second electrode layer may be a reflective electrode layer. In addition, in the structure, which is, so called, a top emitting device, the first electrode layer may be a reflective electrode layer, and the second electrode layer may be a transparent electrode layer.

Electrons and holes are injected respectively by the two electrode layers, and the injected electrons and holes are recombined in the emitting layer, resulting in generating light. The light may be emitted to the substrate in the bottom emitting device, or to the second electrode layer in the top emitting device.

In the structure of the OLED, an indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive index, for example, the light generated in the organic emitting layer in the bottom emitting device is trapped at an interface between the organic layer and the first electrode layer or in the substrate due to a total internal reflection phenomenon, and only a very small amount of light is emitted.

To solve this problem, introduction of a structure capable of scattering or diffusing light into a predetermined part, for example, between a substrate and an electrode layer, of an OLED is known. However, the structure may serve to a pathway for penetrating moisture or oxygen from an external environment, which becomes a cause of considerably degrading reliability of the diode.

DESCRIPTION

Object

The present application provides a method of manufacturing a substrate for an OED or an OED, and the OED.

Solution

One aspect of the present application provides a method of manufacturing a substrate for an OED, including processing an optical functional layer formed on a base layer. The optical functional layer may be processed by, for example, a laser. The optical functional layer may be processed by a laser to have a smaller projected area than the base layer. The term "projected area" as used herein may refer to an area of a projection of an object, such as the base layer, the optical functional layer or the electrode layer, recognized when the substrate is observed from above along a direction parallel to a normal line of the surface of the substrate. Therefore, for example, if the surface of the optical functional layer is uneven and has a large roughness, an actual surface area of the optical functional layer may be larger than that of the electrode layer. However, in this case, if an area of the optical functional layer recognized from above is smaller than an area of the electrode layer recognized from above, it is construed that the optical functional layer has a smaller projected area than the electrode layer. At least a part of the optical functional layer may be removed by the laser to have a smaller projected area than the base layer. In one example, the optical functional layer may be substantially formed on an entire surface of the base layer. The optical functional layer formed on the base layer may be patterned, for example, by the processing described above.

For example, the processing may be performed using a laser. When the processing using a laser is performed, there is no lifting on a cut part of the processed optical functional layer, and thus a surface resistance of the electrode layer to be formed later may be maintained in a suitable level. In addition, as a surface in which a change in height is minimized is provided, a problem such as a short of the device or improper electric connection may be solved.

A kind of the base layer for forming the optical functional layer is not particularly limited, and thus a suitable known material may be used. For example, when a bottom emitting OLED is manufactured, as a transparent base layer, for example, a base layer having a transmittance with respect to light in a visible region of 50% or more may be used. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass, or quartz may be used, and as the polymer base layer, a base layer including polycarbonate (PC), an acryl resin, poly(ethylene terephthalate) (PET), poly(ether sulfide) (PES), or polysulfone (PS) may be used, but the present application is not limited thereto. In addition, as needed, the base layer may be a TFT substrate having a drive TFT. In addition, for example, when the top emitting device is manufactured, the base layer does not need to be a transparent base layer, and a reflective base layer having a reflective layer which is formed of aluminum on a surface of the base layer may be used as needed.

The optical functional layer is formed on a top of the base layer, for example, an entire surface of the top of the base layer. An example of the optical functional layer may be a light scattering layer. The term "light scattering layer" used herein may refer to an any kind of layer formed such that light incident in a direction of an electrode layer to be described later is not or less trapped at an interface between two of the base layer, the light scattering layer, and the electrode layer by scattering, refracting, or diffracting the light incident in the layer. An embodied type of the light scattering layer is not particularly limited as long as it is embodied to have the above-described functions.

For example, the scattering layer may include a scattering particle. FIG. 1 shows that a scattering layer 102 including a scattering particle 1021 is formed on a base layer 101. Referring to FIG. 1, the scattering layer 102 may include the scattering particle 1021 and a binder 1022.

The term "scattering particle" may refer to, for example, a particle capable of scattering incident light since it has a refractive index different from the binder for forming the scattering layer or a planarized layer to be described later, and a suitable size. Such a particle may have a refractive index of 1.0 to 3.5, preferably, approximately 1.0 to 2.0, 1.2 to 1.8, 2.1 to 3.5, or 2.2 to 3.0, and an average diameter of approximately 50 to 20,000 nm or 100 to 5,000 nm. The scattering particle may have a spherical, oval, polygonal, or amorphous shape, but the shape thereof is not particularly limited thereto. The scattering particle may include, for example, an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide. The scattering particle may include any one of the materials, or at least two thereof, or may be formed in a core/shell-type particle or a hollow-type particle as needed.

The scattering layer may further include a binder maintaining the scattering particle. As the binder, for example, as a material capable of maintaining the scattering particle, another adjacent material, for example, a material having the same refractive index as the base layer, may be used.

The binder may be, for example, one of various organic binders, inorganic binders, and organic/inorganic binders known in the art. When necessary, the binder may have a refractive index of approximately 1.4 or more, or approximately 1.45 or more. The upper limit of the refractive index of the binder may be selected in a suitable range in consideration of a refractive index of the particle to be blended with. In consideration of the life span of the device, an inorganic or organic/inorganic binder having excellent thermal resistance and chemical resistance may be used, but an organic binder may be also used as needed. The binder may be, for example, a heat or photo curable monomeric, oligomeric, or polymeric organic material including polyimide, a caldo resin having a fluorine ring, urethane, epoxide, polyester, or acrylate, an inorganic material such as silicon oxide, silicon nitride, silicon oxynitride, or polysiloxane, or an organic/inorganic combination material.

For example, as the binder, polysiloxane, poly(amic acid), or polyimide may be used. The polysiloxane may be prepared by polycondensating a condensable silane compound or a siloxane oligomer, and the binder may form a matrix based on the bond (Si—O) of silicon and oxygen. In the formation of the binder, the binder matrix of polysiloxane only based on the siloxane bond (Si—O), or a matrix in which some of organic groups such as an alkyl group or condensable functional groups such as an alkoxy group remain may be formed by controlling a polycondensation condition and the like.

The poly(amic acid) or polyimide binder may have, for example, a refractive index with respect to light having a wavelength of 633 nm of approximately 1.5, 1.6, 1.65, or 1.7 or more. Such high-refractive poly(amic acid) or polyimide may be prepared, for example, using a monomer to which a halogen atom except fluorine, a sulfur atom, or a phosphorus atom is introduced. As the binder, for example, poly(amic acid) capable of enhancing dispersion stability of particles may be used since it has a part capable of binding to the particle such as a carboxyl group. As the poly(amic acid), for example, a compound including a repeating unit of Formula 1 may be used.

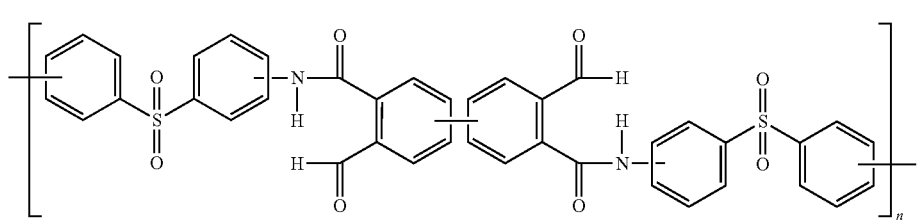

[Formula 1]

In Formula 1, n is a positive number.

The repeating unit may be optionally substituted with at least one substituent. As a substituent, a halogen atom except fluorine, or a functional group including a halogen atom, a sulfur atom, or a phosphorus atom such as a phenyl group, a benzyl group, a naphthyl group or a thiophenyl group may be used.

The poly(amic acid) may be a homopolymer formed only with the repeating unit of Formula 1, or a copolymer including the repeating unit of Formula 1 and another unit. In case of the copolymer, the kind or ratio of another repeating unit may be suitably selected in the range in which a desired refractive index, thermal resistance, or light transmittance is not inhibited.

A specific example of the repeating unit of Formula 1 may be a repeating unit of Formula 2.

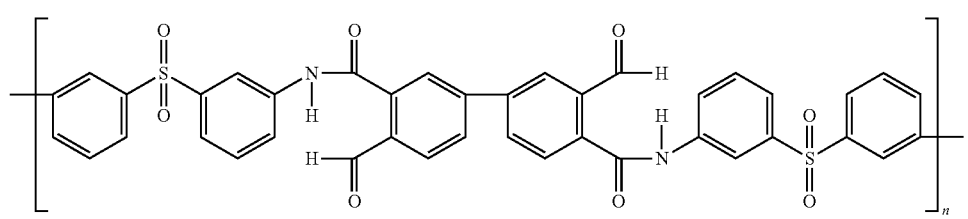

[Formula 2]

In Formula 2, n is a positive number.

The poly(amic acid) may have, for example, a weight average molecular weight converted with standard polystyrene measured by a gel permeation chromatograph (GPC) of approximately 10,000 to 100,0000 or 10,000 to 50,000. In addition, the poly(amic acid) having the repeating unit of Formula 1 has a light transmittance of 80, 85, or 90% or more in the visible region, and excellent thermal resistance.

In addition, the scattering layer may be, for example, a layer having an uneven structure. FIG. 2 shows that the scattering layer 201 having an uneven structure is formed on the base layer 101. When the uneven structure of the scattering layer is suitably controlled, incident light may be scattered.

The scattering layer having an uneven structure may be formed by, for example, coating a heat or photo curable material, and curing the material in contact with a mold capable of transferring a desired shape of the uneven structure during curing, or performing etching. Alternatively, the scattering layer may be formed by blending a particle having suitable size and shape in the binder for forming a scattering layer. In this case, the particle may not need to be a particle having a scattering function, or may have a scattering function.

For example, the scattering layer may be formed by coating a material by a wet coating method, and performing application of heat or radiation of light, curing of the material by a sol-gel method, deposition such as chemical vapor deposition (CVD) or physical vapor deposition (PVD), or microembossing.

When necessary, the optical functional layer may include the scattering layer and a planarized layer formed on the top of the scattering layer. However, when the scattering layer already has a planarized surface, the planarized layer is not necessarily required. When the planarized layer is formed, it is also processed by a laser, and thus at least a part thereof may be removed.

The term "planarized layer" used herein may refer to a layer capable of providing a planarized surface on which an OED may be formed. For example, the planarized layer may provide a surface having a maximum height roughness of 1 μm or less or 0.5 μm. The maximum height roughness may refer to a distance between a straight line passing the maximum point of a roughness curve and a straight line passing the minimum point thereof and parallel to a central line in a roughness curve within a cut off, which may be a value measured with respect to an optional region having an area of 100 μm$^2$ on the planarized surface.

The planarized layer may include, for example, a binder and a particle. For example, the planarized layer may be formed using a composition prepared by mixing a particle having a high refractive index such that a refractive index of the planarized layer may be increased with a binder. As described above, the planarized layer may provide a surface on which an OED including an electrode layer is formed. In addition, the planarized layer may embody excellent light extraction efficiency through interaction with a scattering layer to be described later in some cases. For example, the planarized layer may have the same refractive index as an adjacent electrode layer, which may be, for example, approximately 1.8 to 3.5 or 2.2 to 3.0. The term "refractive index" used herein may be, unless particularly defined otherwise, a refractive index with respect to light having a wavelength of 400 to 450 nm in a vacuum state.

As the binder forming a planarized layer, a known material may be used without particular limitation. The binder may be, for example, one of various organic binders, inorganic binders, and organic/inorganic binders, which are known in the art. When necessary, a binder having a refractive index of approximately 1.4 or 1.45 or more may be used. As the binder forming a planarized layer, for example, a suitable kind is selected from the binders used to form the scattering layer described above.

The planarized layer may include a high refractive particle with the binder. The term "high refractive particle" may refer to, for example, a particle having a refractive index of 1.5, 2.0, 2.5, 2.6, or 2.7 or more. The upper limit of the refractive index of the high refractive particle may be selected in the range capable of satisfying the above-described refractive index of the planarized layer in consideration of, for example, a refractive index of the binder blended therewith. The high refractive particle may have, for example, an average diameter smaller than that of the scattering particle. The high refractive particle may have an average diameter of, for example, approximately 1 to 100, 10 to 90, 10 to 80, 10 to 70, 10 to 60, 10 to 50, or 10 to 45 nm. As a high refractive particle, alumina, alumino silicate, titanium oxide, or zirconium oxide may be used. As the high refractive particle, for example, as a particle having a refractive index of 2.5 or more, rutile-type titanium oxide may be used. The rutile-type titanium oxide has a higher refractive index than other particles. Therefore, when the high refractive particle is included in the material for forming a planarized layer at a relatively small amount, the planarized layer having a high refractive index may be embodied.

A ratio of the high refractive particle in the planarized layer is not particularly limited and may be controlled within the range capable of ensuring the above-described refractive index of the planarizing layer. For example, when a particle having a refractive index of 2.5 or more such as rutile-type titanium oxide is used as the high refractive particle, the high refractive particle may be included in the planarized layer at a ratio of 300, 250, or 200 parts by weight or less with respect to 100 parts by weight of the binder. The lower limit of the ratio of the high refractive particle may be, for example, 40, 60, 80, or 100 parts by weight or more. Unless particularly defined otherwise, the unit "parts by weight" used herein refers to a ratio of weights between components. When an OED is formed by maintaining a ratio between the binder and the particle as described above, for example, a device having excellent performance and reliability may be provided by increasing external quantum efficiency, preventing penetration of gas or moisture from an external environment, and reducing outgassing.

In another example, the planarized layer may be formed using a material prepared by blending a compound such as an alkoxide or acylate of a metal such as zirconium, titanium, or cerium with a binder having a polar group such as a carboxyl group or a hydroxyl group. The compound such as an alkoxide or acylate may be condensed with the polar group of the binder, and provide the metal to a backbone of the binder, thereby embodying a high refractive index. Examples of the alkoxide or acylate compound may include a titanium alkoxide such as tetra-n-butoxy titanium, tetraisopropoxy titanium, tetra-n-propoxy titanium, or tetraethoxy titanium, titanium acylate such as titanium stearate, a titanium chelate, zirconium alkoxide such as tetra-n-butoxy zirconium, tetra-n-propoxy zirconium, tetraisopropoxy zirconium, or tetraethoxy zirconium, zirconium acylate such as zirconium tributoxystearate, or a zirconium chelate. In addition, the planarized layer may be formed by sol-gel coating including preparing a coating solution by blending a metal alkoxide such as titanium alkoxide or zirconium alkoxide with a solvent such as alcohol or water, coating the coating solution, and plasticizing the coated solution at a suitable temperature.

A thickness of the planarized layer is not particularly limited, and may be controlled in a suitable range as needed.

The optical functional layer is formed on the base layer and then processed by a laser, and thus at least a part thereof is removed. For example, as shown in FIG. 3, at least a part of the optical functional layer may be removed by irradiating a laser (the arrow of FIG. 3) to an optical functional layer 301 formed on an entire surface of the base layer 101. FIG. 3 schematically shows that a laser is irradiated to the optical functional layer or the stacked structure 301, but the present application is not limited thereto. For example, when the base layer 101 is a transparent base layer, the laser may be irradiated to the base layer 101. In addition, a shape of the optical functional layer remaining after the removal is also shown in FIG. 3, but the present application is not limited thereto. For example, the optical functional layer 301 remaining after processing, as shown in FIG. 5, may also remain at an edge of the base layer 101.

The kind of laser used in the above operation is not particularly limited. For example, any kind of laser having a suitable power and capable of suitably removing a stacked structure of the optical functional layer and the planarized layer may be used.

The laser may be, for example, a fiber diode laser, a solid laser such as ruby (e.g., $Cr^{3+}:Al_2O_3$) or YAG ($Nd^{3+}:Y_3Al_5O_{12}$), a gas laser such as phosphate glass, silicate glass, a $CO_2$ laser, or an excimer laser, a liquid laser, a semiconductor laser, or YLF($Nd^{3+}:LiYF_4$). Such a laser may be irradiated in the type of a spot laser or a line beam laser. When necessary, for effective irradiation, a laser irradiating apparatus may be configured to include a focusing head 11, an optical fiber, and a laser source.

A condition of irradiating a laser is not particularly limited as long as it is controlled to perform suitable processing. For example, a laser having a wavelength of approximately 200 to 400 nm or 700 to 1,500 nm may be irradiated with a power of approximately 1 to 150 or 10 to 300 W, but the present application is not limited thereto.

A type of processing the optical functional layer using a laser is not particularly limited and may be changed according to a purpose. For example, the processing may be performed by removing a part of the optical functional layer such that a range of the remaining optical functional layer may overlap an emitting layer of an organic layer which will be subsequently formed when they are observed from above. Other than that, when necessary, the optical functional layer may be processed in various patterns. In addition, the optical functional layer present in a part corresponding to a region to which an adhesive is coated to be in contact with an encapsulating layer which will be subsequently formed through laser processing or to a terminal region formed on an external substrate in an encapsulating region after the device is completely manufactured may be removed.

During the above operation, forming an electrode layer on the optical functional layer processed by laser processing may be further included to remove the substrate for an OED. In this case, the electrode layer may be formed to have a large projected area than the processed optical functional layer. In addition, the electrode layer may be formed on both of the tops of the processed optical functional layer and the base layer on which the optical functional layer is not formed.

FIGS. 4 to 6 show types of the substrate after the electrode layer is formed. As show in FIGS. 4 to 6, the optical functional layer may be processed in various types if it has a projected area smaller than the base layer and the electrode layer. For example, as shown in FIG. 4, the optical functional layer 301 may be formed only in a part except the edge of the base layer 101, or as shown in FIG. 5, a part of the optical functional layer 301 may remain at the edge of the base layer 101.

FIG. 6 shows the substrate of FIG. 4 when being observed from above. As shown in FIG. 6, an area (A), that is, a projected area (A), of the electrode layer 401 recognized when the substrate is observed from above is formed to be larger than a projected area (B) of the optical functional layer 301 laying below. A ratio (A/B) of the projected area (A) of the electrode layer and to the projected area (B) of the optical functional layer may be, for example, 1.04, 1.06, 1.08, 1.1, or 1.15 or more. When the projected area of the optical functional layer is smaller than that of the electrode layer, a structure in which an optical functional layer to be described later is not exposed to an external environment, and thus the upper limit of the ratio (A/B) of the projected area is not particularly limited. In consideration of a general environment of manufacturing a substrate, the upper limit of the ratio (A/B) may be, for example, approximately 2.0, 1.5, 1.4, 1.3, or 1.25. In the substrate, the electrode layer may also be formed on the top of the base layer on which the optical functional layer is not formed. The electrode layer may be formed in contact with the base layer, or may be formed by including an additional component between the electrode layer and the base layer. According to such a structure, during the embodiment of an OED, a structure in which the optical functional layer is not exposed to an external environment may be embodied.

For example, as shown in FIG. 6, the electrode layer 401 may be formed in a region including a region beyond all of peripheral regions of the optical functional layer when being observed from above. In this case, for example, as shown in FIG. 5, when a plurality of optical functional layers are present on the base layer, the electrode layer may be formed in the region including the region beyond all of the peripheral regions of at least one of the optical functional layers, for example, the optical functional layer on which at least an organic layer will be formed as will be described later. For example, in the structure of FIG. 5, when the organic layer is formed on the top of the optical functional layer present at right and left edges thereof, the structure of FIG. 5 may be changed to form the electrode layer up to the region beyond all of the peripheral regions of the optical functional layer present at the right and left edges by being extended to left and right sides. In the above structure, a structure in which the optical functional layer is not exposed to an external environment may be formed by a method of attaching an encapsulating structure to be described later to the electrode layer below which the optical functional layer is not formed. Accordingly, penetration of external moisture or oxygen through the optical functional layer may be prevented, an adhering strength between an encapsulating layer or an electrode and the substrate may be stably ensured, and a surface hardness of the edge of the device may be excellently maintained.

As the electrode layer, for example, a conventional hole injection or electron injection electrode layer used to manufacture of an OED such as an OLED may be formed.

The hole injection electrode layer may be formed, for example, using a material having a relatively high work function and using a transparent material when necessary. For example, the hole injection electrode layer may include a metal, an alloy, an electric conductive compound having a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag, or Cu and a high refractive transparent material such as ZnS, $TiO_2$, or ITO.

The hole injection electrode layer may be formed by an optional means such as deposition, sputtering, chemical deposition, or electrochemical means. In addition, as needed, the formed electrode layer may be patterned through a known process such as photolithography or a shadow mask. A thickness of the hole injection electrode layer may vary depending on a light transmittance or surface resistance, and may be conventionally within a range of 500 nm or 10 to 200 nm.

A transparent electron injection electrode layer may be formed, for example, using a transparent material having a relatively low work function, or for example, may be formed using a suitable material of the materials used to form the hole injection electrode layer, but the present application is not limited thereto. The electron injection electrode layer may also be formed using, for example, deposition or sputtering, or may be suitably patterned when necessary. The electron injection electrode layer may be formed to have a suitable thickness as needed.

Another aspect of the present application provides a method of manufacturing an OED, for example, an OLED.

The illustrative method may include sequentially forming an organic layer including an emitting layer and a second electrode layer on the manufactured substrate, for example, on the top of the optical functional layer or the above-described electrode layer. When necessary, that is, when the electrode layer is not previously formed on the substrate, a first electrode layer may be further formed on the substrate before the organic layer is formed. In this case, the first electrode layer may be formed to have a larger projected area than the optical functional layer as described above.

The kind of the organic layer formed on the substrate is not particularly limited. In this art, for example, various functional materials for forming an OLED and method of preparing the same are known.

The organic layer may include at least one emitting layer. The organic layer may include multiple, that is, at least two emitting layers. When the at least two emitting layers are included, the emitting layers may have a structure split by an inter-electrode having a charge generating characteristic or a charge generating layer (CGL), but the present application is not limited thereto.

The emitting layer may be formed using, for example, various fluorescent or phosphorescent organic materials known in the art. An example of the material capable of being used in the emitting layer may be, but is not limited to, a fluorescent material such as an Alq-based material such as tris(4-methyl-8-quinolinolate)aluminum(III) (Alg3), 4-MAlq3, or Gaq3; a cyclopenadiene derivative such as C-545T($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP); 4,4'-bis(2,2'-diphenylyinyl)-1,1'-biphenyl (DPVBi), distyryl benzene, or a derivative thereof; or 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir$(bpy), $F_2Ir(acac)$, $op_2Ir(acac)$, $ppy_2Ir(acac)$, $tpy_2Ir(acac)$, fac-tris[2-(4,5'-difluorophenyl)pyridine-C'2,N]iridium(III) (FIrppy), or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX, or DCJTB as a dopant.

The emitting layer may also be formed by suitably employing any one of an electron accepting organic compound and an electron donating organic compound exhibiting emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, or a derivative thereof; a metal chelate complex compound disclosed in the patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470, or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato) indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in the patent publication such as Japanese Patent Application Laid-Open No. 1993-202011, Japanese Patent Application Laid-Open No. 1995-179394, Japanese Patent Application Laid-Open No. 1995-278124, or Japanese Patent Application Laid-Open No. 1995-228579; a triazine compound disclosed in the patent publication such as Japanese Patent Application Laid-Open No. 1995-157473; a stilbene derivative disclosed in the patent publication such as Japanese Patent Application Laid-Open No. 1994-203963; a distyrylarylene derivative; a styryl derivative disclosed in the patent publication such as Japanese Patent Application Laid-Open No. 1994-132080 or Japanese Patent Application Laid-Open No. 1994-88072; a diolefin derivative disclosed in the patent publication such as Japanese Patent Application Laid-Open No. 1994-100857 or Japanese Patent Application Laid-Open No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidene compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl) biphenyl, or a derivative thereof; a silanamine derivative disclosed in the patent publication such as Japanese Patent Application Laid-Open No. 1994-49079 or Japanese Patent Application Laid-Open No. 1994-293778; a multifunctional styryl compound disclosed in the patent publication such as Japanese Patent Application Laid-Open No. 1994-279322 or Japanese Patent Application Laid-Open No. 1994-279323; an oxadiazole derivative disclosed in the patent publication such as Japanese Patent Application Laid-Open No. 1994-107648 or Japanese Patent Application Laid-Open No. 1994-092947; an anthracene compound disclosed in the patent publication such as Japanese Patent Application Laid-Open No. 1994-206865; an oxinate derivative disclosed in the patent publication such as Japanese Patent Application Laid-Open No. 1994-145146; a tetraphenyl butadiene compound disclosed in the patent publication such as Japanese Patent Application Laid-Open No. 1992-96990; an organic trifunctional compound disclosed in the patent publication such as Japanese Patent Application Laid-Open No. 1991-296595; a coumarin derivative disclosed in the patent publication such as Japanese Patent Application Laid-Open No. 1990-191694; a perylene derivative disclosed in the patent publication such as Japanese Patent Application Laid-Open No. 1990-196885; a naphthalene derivative disclosed in the patent publication such as Japanese Patent Application Laid-Open No. 1990-255789; a phthaloperynone derivative disclosed in the patent publication such as Japanese Patent Application Laid-Open No. 1990-289676 or Japanese Patent Application Laid-Open No. 1990-88689; or a styryl amine derivative disclosed in the patent publication such as Japanese Patent Application Laid-Open No. 1990-250292 may be used as an electron accepting organic compound included in a low refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode to an electron injection electrode through the emitting layer, and may be formed in a suitable part between the emitting layer and the electron injection electrode using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine, or 4,4"-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer or using a polymer derived from the organic compound. In addition, a π-conjugated polymer such as polyparaphenylenevinylene and a derivative thereof, a hole transport non-conjugated polymer such as poly(N-vinylcarbazole), or a σ-conjugated polymer of polysilane may also be used.

The hole injection layer may be formed using an electrically-conductive polymer such as metal phthalocyanine such as copper phthalocyanine or non-metal phthalocyanine, a carbon layer, and polyaniline, or may be formed by reaction with a Lewis acid using the aryl amine compound as an oxidizing agent.

Various materials for forming the above-described organic layer, for example, the emitting layer, the electron injection or transport layer, or the hole injection or transport layer, and methods of forming the same are known in the art, and all of the above-described methods may be applied to manufacture the OED.

After the organic layer is formed, a second electrode layer may be formed. When the first electrode layer is hole-injectable, for example, the second electrode layer may be electron-injectable, and when the first electrode layer is electron-injectable, the second electrode layer may be hole-injectable. A method of forming the second electrode layer may be a conventional method known in the art without particular limitation.

After the second electrode layer is formed, an encapsulating structure may be formed. The encapsulating structure may be a protective structure for preventing inflow of an external material such as moisture or oxygen to the organic layer of the OED. The encapsulating structure may be, for example, a can such as a glass can or metal can, or a film covering an entire surface of the organic layer.

FIG. 7 shows formation of an encapsulating structure 703 in a can structure such as a glass can or a metal can after the organic layer 701 and the second electrode layer 702 are sequentially formed on the substrate including the base layer 101, the optical functional layer 301, and the first electrode layer 401. As shown in FIG. 7, for example, the encapsulating structure 703 may be adhered by an adhesive 704. The encapsulating structure may be adhered to the electrode layer 401, for example, below which the optical functional layer 301 is not present. For example, as shown in FIG. 7, the encapsulating structure 703 may be adhered to an end of the substrate by the adhesive 704. According to such a method, a protecting effect through the encapsulating structure may be maximized.

The encapsulating structure may be, for example, a film coating entire surfaces of the organic layer and the second electrode layer. FIG. 8 shows an encapsulating structure 801 formed in a film type covering entire surfaces of the organic layer 701 and the second electrode layer 702. For example, as shown in FIG. 8, the film-type encapsulating structure 801 may have a structure which coats entire surfaces of the organic layer 701 and the second electrode layer 702, and in which the substrate including the base layer 101, the optical functional layer 301 and the electrode layer 401 is adhered to a second substrate 802 laying above. Here, the second substrate may be, for example, a glass substrate, a metal substrate, a polymer film, or a barrier layer. The film-type encapsulating structure may be formed by, for example, coating a liquid material cured by heat or UV irradiation such as an epoxy resin, and curing the coated material, or laminating the substrate and the upper substrate using an adhesive sheet previously manufactured in a film type using the epoxy resin.

The encapsulating structure may include a water adsorbent or a getter such as a metal oxide such as calcium oxide or beryllium oxide, a metal halide such as calcium chloride, or phosphorus pentoxide as needed. For example, the water adsorbent or a getter may be included in a film-type encapsulating structure, or present at a predetermined position of a can-type encapsulating structure. The encapsulating structure may further include a barrier film or conductive film.

For example, as shown in FIG. 7 or 8, the encapsulating structure may be adhered to the top of the first electrode layer below which the optical functional layer is not formed. Thus, a sealing structure in which the optical functional layer is not exposed to an external environment may be embodied. The sealing structure may refer to, for example, a state in which an entire surface of the optical functional layer is surrounded by the base layer, the electrode layer, and/or the encapsulating structure, or surrounded by the sealing structure formed by including the base layer, the electrode layer, and/or the encapsulating structure, and thus not exposed to an external environment. The sealing structure may include only the base layer, the electrode layer, and/or the encapsulating structure, or also include another component, for example, a conductive material or an intermediate layer with the base layer, the electrode layer, and the encapsulating structure as long as the optical functional layer is not exposed to an external environment. For example, in FIG. 7 or 8, another component may be present in a part in which the base layer 101 is in contact with the electrode layer 401 or in which the first electrode layer 401 is in contact with the encapsulating structure 701 or 801, or at another position. As the component, an organic material, inorganic material, or organic/inorganic combination material having low moisture permeability, or an insulating layer or an auxiliary electrode may be used.

Effect

According to the methods of manufacturing a substrate for forming an OED such as an OLED and an OED, a substrate for forming a device having excellent light extraction efficiency and improved reliability by preventing penetration of moisture or air into the device, or device using the same can be provided.

EXPLANATION OF THE MARK

Figure 1:
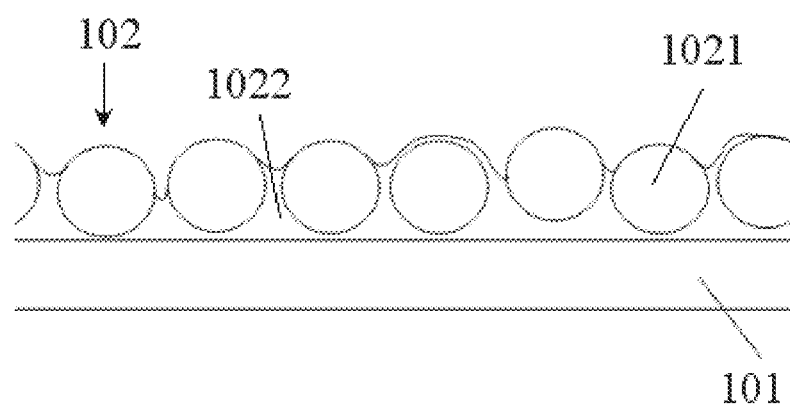
FIGS. 1 and 2 show schematics of illustrative embodiments of the optical functional layers.
Figure 2:
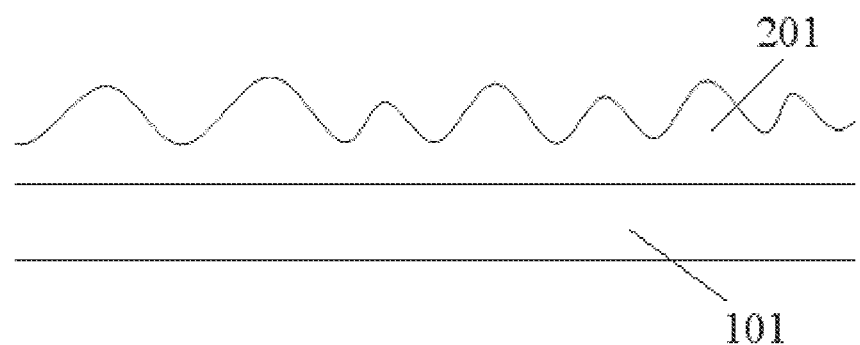
Figure 3:
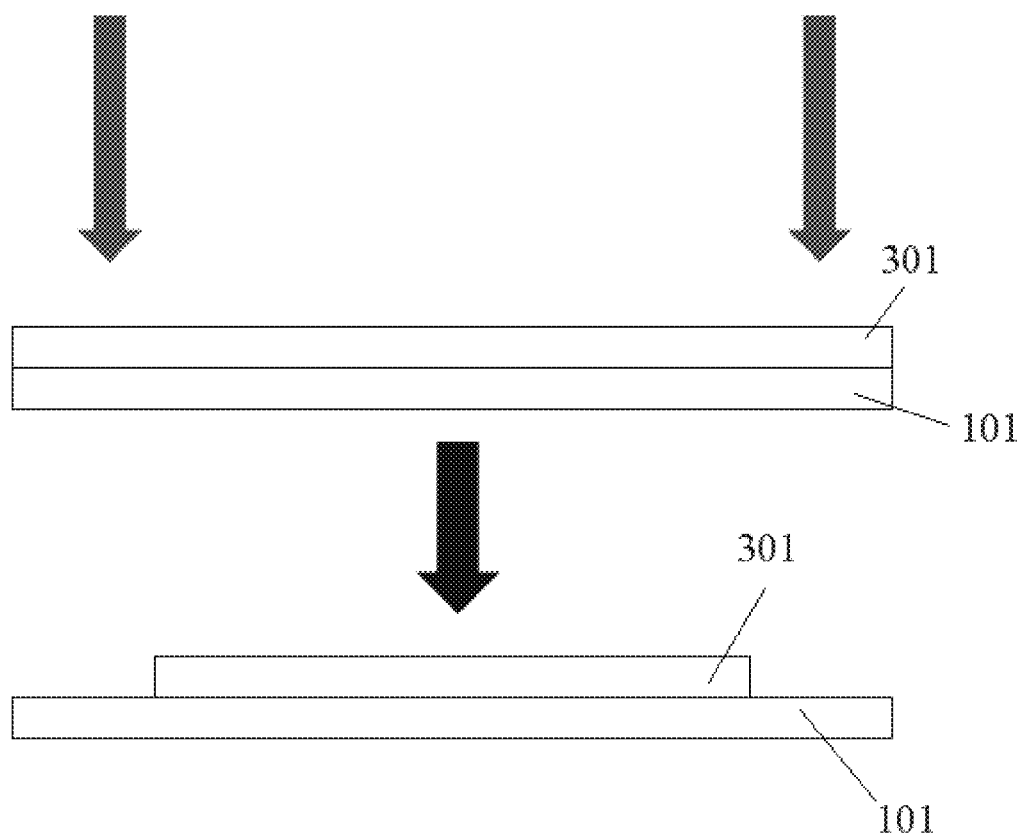
FIG. 3 shows a schematic of an illustrative embodiment of a method for manufacturing a substrate for an OED.
Figure 4:
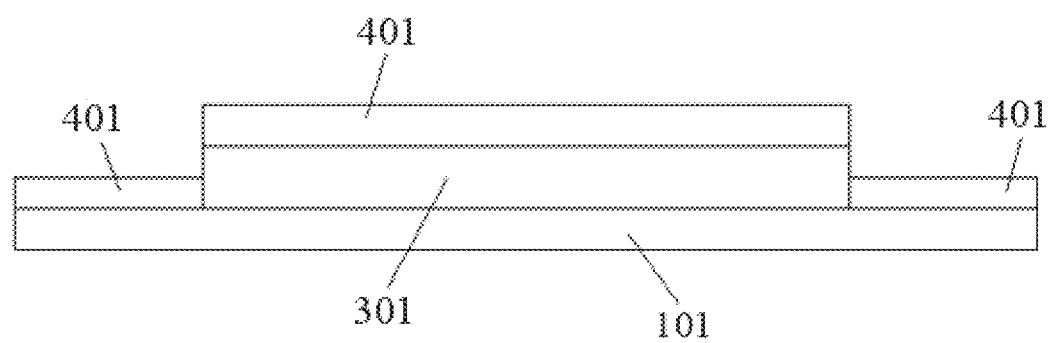
FIGS. 4 to 6 show schematics of illustrative embodiments of structures in which an electrode layer is formed on an optical functional layer.

101: the base layer
102, 201, 301: the optical functional layers
1021: the scattering particle
1022: the binder
401: the electrode layer, the first electrode layer
701: the organic layer
702: the second electrode layer
703, 801: the encapsulating structure
704: the adhesive
802: the second substrate

DETAILED DESCRIPTION OF ILLUSTRATIVE EMBODIMENTS

Hereinafter, illustrative embodiments of the present application will be described in detail. However, the present application is not limited to the embodiments disclosed below.

Example 1

Figure 5:
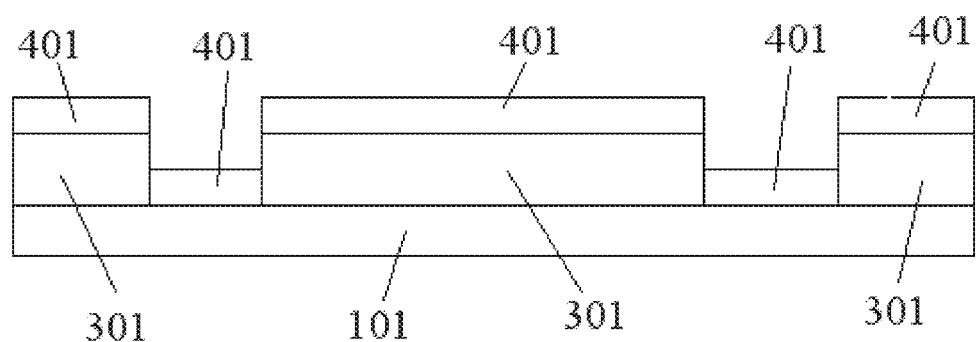
Figure 6:
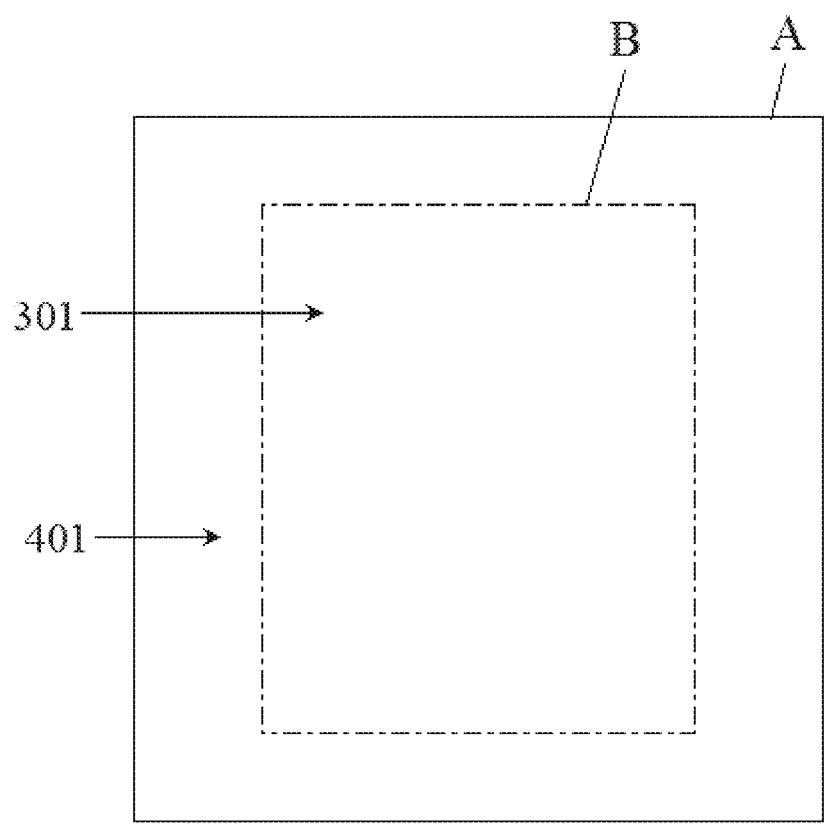
Figure 7:
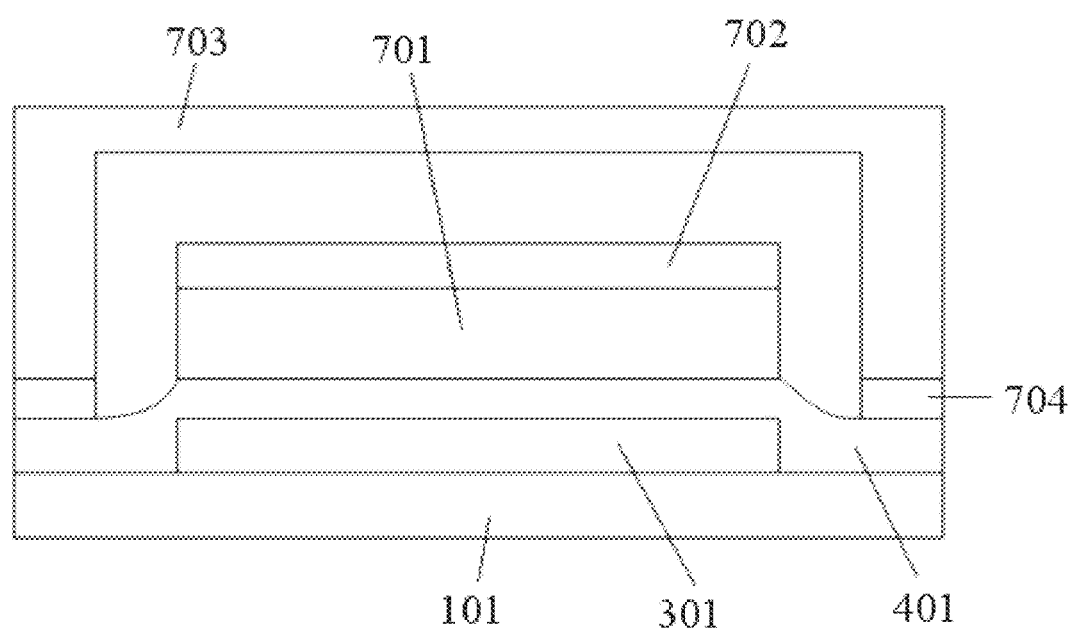
FIGS. 7 and 8 schematics of illustrative embodiments of the OEDs having an encapsulating structure.
Figure 8:
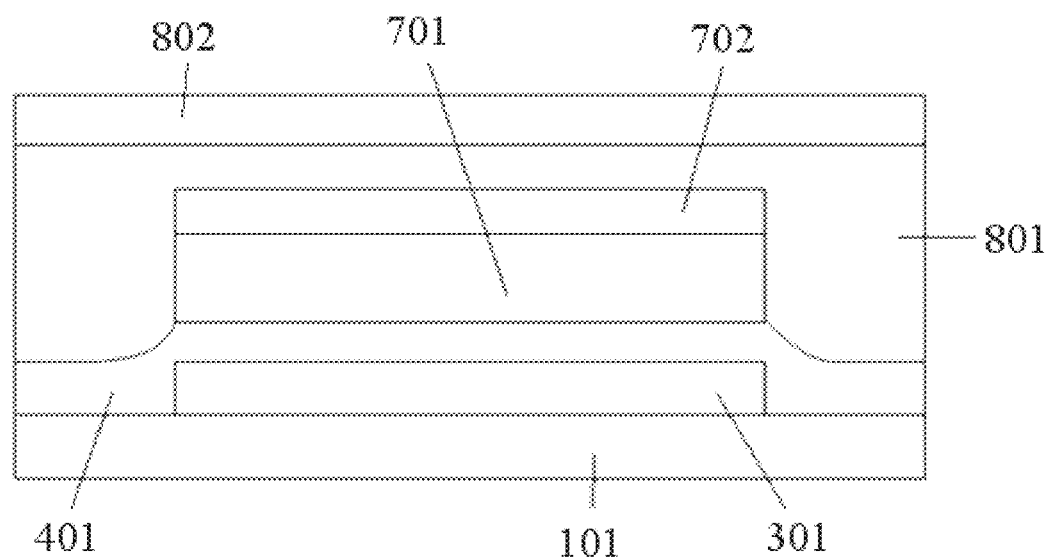

A coating solution was prepared by sufficiently dispersing $TiO_2$ particles having an average diameter of approximately 200 nm in a siloxane binder ($Si(OCH_3)_4$) solution. A scattering layer was formed by coating the prepared coating solution on a glass base. Afterward, a planarized layer was formed by coating the siloxane binder (refractive index after drying: approximately 1.8) in which a high refractive filler (titanium dioxide) having an average diameter of approximately 10 nm is dispersed on the scattering layer. Subsequently, the planarized layer and the scattering layer were patterned to have a patterning width of approximately 3 mm by irradiating a laser, and a light extraction layer coated in the region except an emitting region was removed. Particularly, the scattering layer and the planarized layer were patterned in a horizontal direction, and patterned again in a vertical direction using a laser, resulting in processing the layers so as for the scattering layer and the planarized layer to be remained in tetragonal shapes. A substrate, on which the patterned optical functional layer (the scattering layer and the planarized layer) was formed as in, for example, FIG. 5, was formed by forming an ITO transparent electrode on the entire surface thereof according to a conventional method, and then an organic layer including an emitting layer, and a metal electrode were sequentially stacked. Afterward, an encapsulating structure (glass can) was adhered, resulting in embodying a device as shown in FIG. 7.

Comparative Example 1

An OLED was manufactured as described in Example 1, except that laser processing was not performed.

Experimental Example 1

Figure 9:
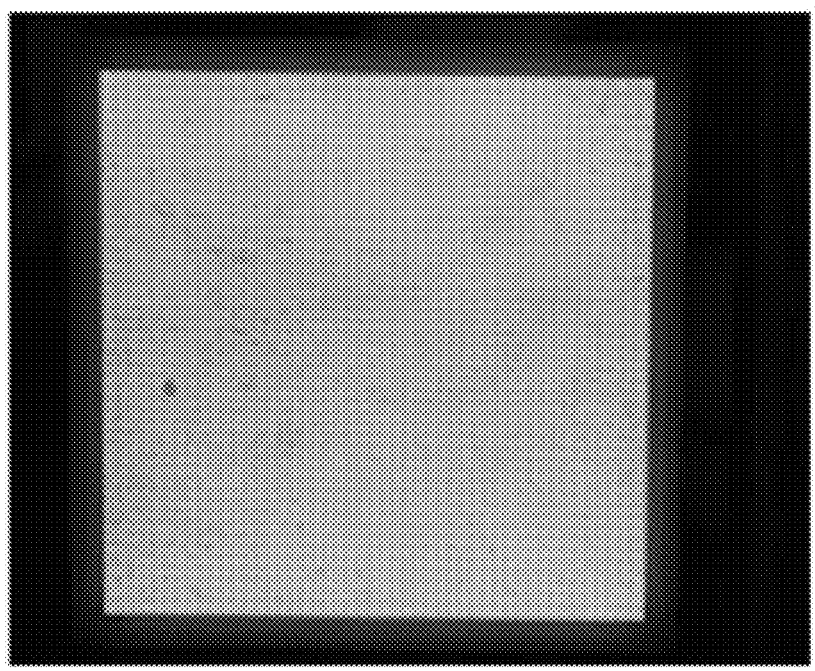
FIG. 9 is a drawing observing an emitting state of Comparative Example 1.
Figure 9:
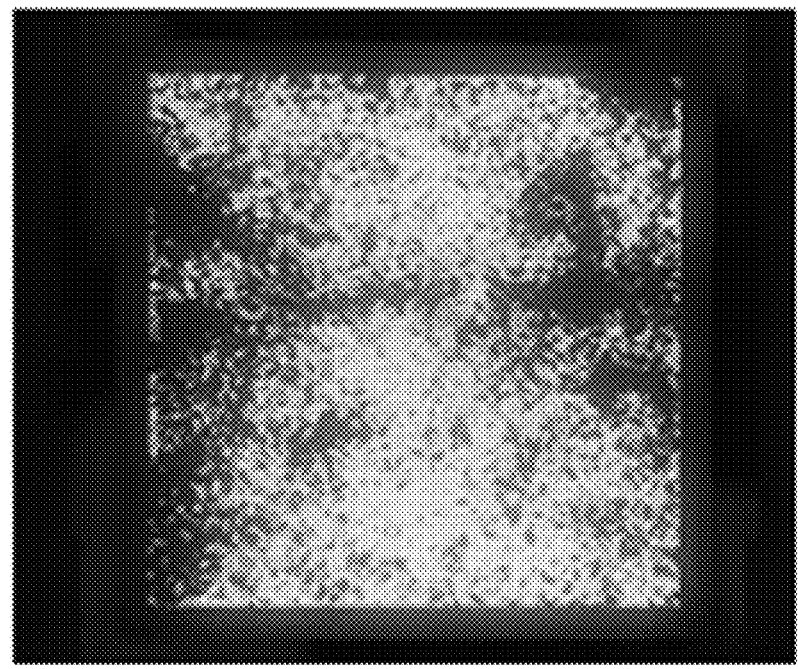
Figure 10:
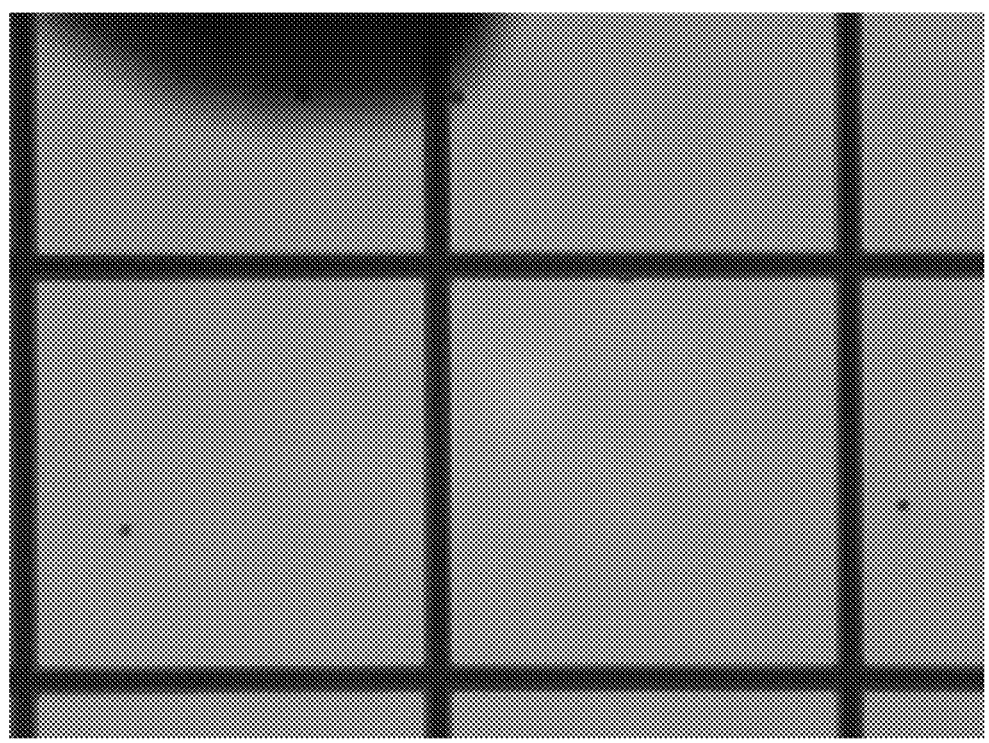
FIG. 10 is a drawing observing an emitting state of Example 1.

An emitting state was photographed with respect to the OED manufactured in Example 1 or Comparative Example 1. Then, an appearance of the diode was photographed again in an 85° C. oven after 500 hours. FIG. 9 shows a result obtained by observing an appearance of the OED according to Comparative Example 1 in the early stage (a) and after 500 hours (b). FIG. 10 shows a result obtained by observing an appearance of the OED according to Example 1 in the early stage (a) and after 500 hours (b). Referring to FIG. 9, it can be seen that, according to Comparative Example 1, after 500 hours, relatively darker emitting regions were increased, and emission uniformity was considerably degraded in general. Contrarily, according to Example 1, as shown in FIG. 10, it was confirmed that, even after 500 hours, there were less darker emitting regions, and the emission uniformity was maintained.

What is claimed is:

1. A method of manufacturing a substrate for an organic electronic device, comprising processing an optical functional layer on a base layer with a laser so as to have a smaller projected area than the base layer,
    wherein the optical functional layer comprises a scattering layer and a planarized layer formed on the scattering layer,
    wherein both the scattering layer and the planarized layer are processed by the laser,
    wherein the scattering layer is a layer comprising an uneven structure, and
    wherein the planarized layer comprises a binder and a high refractive index particle.

2. The method according to claim 1, wherein the scattering layer is a layer comprising a scattering particle.

3. The method according to claim 1, wherein the optical functional layer is formed on the base layer by a wet coating, sol-gel, deposition, or microembossing method.

4. The method according to claim 1, wherein the processing is performed by irradiating a laser toward the optical functional layer or the base layer.

5. The method according to claim 1, wherein the processing is performed by irradiating a spot laser or a line beam laser.

6. The method according to claim 1, further comprising forming an electrode layer on the processed optical functional layer to have a larger projected area than the optical functional layer.

7. The method according to claim 6, wherein the electrode layer is formed to have a ratio (A/B) of a projected area (A) of the electrode layer and a projected area (B) of the optical functional layer of 1.04 or more.

8. A method of manufacturing an organic electronic device, comprising: sequentially forming an organic layer comprising an emitting layer and a second electrode layer on an optical functional layer of the substrate formed in claim 1.

9. The method according to claim 8, further comprising: forming a first electrode layer having a larger projected area than the optical functional layer before forming the organic layer on the substrate.

10. The method according to claim 9, wherein the first electrode layer is formed to have a ratio (A/B) of a projected area (A) of the first electrode layer and a projected area (B) of the optical functional layer of 1.04 or more.

11. The method according to claim 9, further comprising forming an encapsulating structure after the second electrode layer is formed.

12. The method according to claim 11, wherein the encapsulating structure is formed on the base layer in contact with the first electrode layer below which the optical functional layer is not formed.

* * * * *